United States Patent
Qi et al.

(10) Patent No.: US 10,690,733 B2
(45) Date of Patent: Jun. 23, 2020

(54) MAGNETIC IMAGE SENSOR

(71) Applicant: WEIHAI HUALING OPTO-ELECTRONICS CO., LTD., Shandong (CN)

(72) Inventors: Wuchang Qi, Shandong (CN); Mingfeng Sun, Shandong (CN)

(73) Assignee: WEIHAI HUALING OPTO-ELECTRONICS CO., LTD., Shandong (CN)

(*) Notice: Subject to any disclaimer, the term of this patent is extended or adjusted under 35 U.S.C. 154(b) by 0 days.

(21) Appl. No.: 15/745,439

(22) PCT Filed: Dec. 23, 2016

(86) PCT No.: PCT/CN2016/111769
§ 371 (c)(1),
(2) Date: Jan. 17, 2018

(87) PCT Pub. No.: WO2017/114314
PCT Pub. Date: Jul. 6, 2017

(65) Prior Publication Data
US 2018/0306875 A1    Oct. 25, 2018

(30) Foreign Application Priority Data
Dec. 29, 2015    (CN) .......................... 2015 1 1019323

(51) Int. Cl.
*G01R 33/02* (2006.01)
*G01R 33/09* (2006.01)
(Continued)

(52) U.S. Cl.
CPC .......... *G01R 33/091* (2013.01); *G01R 33/09* (2013.01); *G01R 33/093* (2013.01);
(Continued)

(58) Field of Classification Search
CPC .... G01R 33/09; G01R 33/098; G01R 33/093; G01R 33/096; G01R 33/091; G01R 33/07; G01R 33/0052
(Continued)

(56) References Cited

U.S. PATENT DOCUMENTS

2007/0075712 A1* 4/2007 Fitzgerald .......... G01R 31/2884
                                                          324/715
2009/0153138 A1* 6/2009 Theuss .................... H01L 24/96
                                                          324/251
(Continued)

FOREIGN PATENT DOCUMENTS

CN    2218949 Y    1/1996
CN    101382993 A  3/2009
(Continued)

OTHER PUBLICATIONS

JP 2012047685 machine translation, Mar. 8, 2012. (Year: 2012).*
International Search report for PCT Application No. PCT/CN2016/111769 filed on Dec. 23, 2016, dated Jul. 3, 2017.

*Primary Examiner* — Raul J Rios Russo
(74) *Attorney, Agent, or Firm* — Gang Yu

(57) ABSTRACT

A magnetic image sensor is provided. The magnetic image sensor includes: a magnetic resistance (1), arranged along a scanning direction and configured to detect a changed magnetic signal in a range to be detected; a configuration resistance (2), connected with the magnetic resistance (1), wherein a resistance value of the configuration resistance (2) is adjustable; and a driving circuit (3), connected with the magnetic resistance (1) and configured to perform output control on the changed magnetic signal detected by the magnetic resistance (1) The problem of relatively stronger noise signal caused by a magnetic resistance deviation of a magnetic image sensor is solved.

9 Claims, 6 Drawing Sheets

(51) Int. Cl.
  *G07D 7/04* (2016.01)
  *G07D 7/20* (2016.01)
  *G01R 33/07* (2006.01)
  *G01R 33/00* (2006.01)

(52) U.S. Cl.
  CPC ......... *G01R 33/096* (2013.01); *G01R 33/098* (2013.01); *G07D 7/04* (2013.01); *G07D 7/20* (2013.01); *G01R 33/0052* (2013.01); *G01R 33/07* (2013.01)

(58) Field of Classification Search
  USPC ...... 324/51, 55, 200, 207.21, 227, 228, 244, 324/252
  See application file for complete search history.

(56) References Cited

U.S. PATENT DOCUMENTS

| | | | | |
|---|---|---|---|---|
| 2014/0340081 A1* | 11/2014 | Kurumado | ........... | G01R 33/093 324/252 |
| 2015/0260805 A1* | 9/2015 | Miura | ................ | G01R 33/1253 324/228 |
| 2015/0261981 A1* | 9/2015 | Ogomi | ............... | G01R 33/0094 235/449 |
| 2017/0215012 A1* | 7/2017 | Deak | .................... | H04R 25/305 |

FOREIGN PATENT DOCUMENTS

| | | |
|---|---|---|
| CN | 104105977 A | 10/2014 |
| CN | 104346857 A | 2/2015 |
| CN | 105701904 A | 6/2016 |
| CN | 205302449 U | 6/2016 |
| JP | S63-173659 A | 7/1988 |
| JP | S63-242657 A | 10/1988 |
| JP | H3-179214 A | 8/1991 |
| JP | H4-053758 A | 2/1992 |
| JP | H9-104128 A | 4/1997 |
| JP | 2002042203 A | 2/2002 |
| JP | 2005249468 A | 9/2005 |
| JP | 2010085338 A | 4/2010 |
| JP | 2012047685 A | 3/2012 |
| JP | 2014215220 A | 11/2014 |

\* cited by examiner

MAGNETIC IMAGE SENSOR

TECHNICAL FIELD

The disclosure relates to the field of sensors, and particularly to a magnetic image sensor.

BACKGROUND

Producing specific magnetic information on a medium such as paper money, a note and a negotiable security is one of important means of a modern anti-counterfeiting technology. Along with development of a production technology, application of a magnetic information anti-counterfeiting technology is continuously enhanced. For example, banknotes of many countries (such as Renminbi, U.S. dollars, Euros, so on) internally include magnetic information with rich content. Recognition over the specific magnetic information on the medium such as the paper money, the note and the negotiable security is also necessary anti-counterfeiting detection means.

In order to implement detection, a magnetic image sensor is provided in a related technology. In the magnetic image sensor, miniature magnetic heads are continuously arranged in the whole reading and recognition range to form a linear array of the miniature magnetic heads, thereby implementing reading and recognition on magnetic information in the whole reading range. However, each single magnetic head is relatively larger in size, and a reading and recognition range on each magnetic head occupies a small part of a range of the magnetic head, so that a large range between the magnetic heads are outside a effective reading range of the magnetic heads, that is, it is impossible to read the region between the magnetic heads. When such a magnetic image sensor is used, the magnetic information at a gap between the magnetic heads may get lost.

A magnetic sensing device is further provided in the related technology. Multiple recesses linearly formed along a side length direction of an internal bracket are formed in an upper surface of the internal bracket of the magnetic sensing device. A magneto-resistive element is accommodated in each recess, and the magneto-resistive elements are arranged into a linear array within a reading and recognition range to read and recognize magnetic information in the reading range. In this technology, the magnetic head is replaced with the magneto-resistive element, and the gap between the magneto-resistive elements is greatly reduced, so that the whole magnetic sensing device is miniaturized. However, the magneto-resistive element has an excessively large linear dimension, the magnetic information in the range of the dimension is not able to be distinguished in detail, the read magnetic information on a medium is very blurred, and details of the magnetic information is not able to be distinguished. Therefore, when finer characteristics of magnetic information regions are required to be judged, this magnetic sensing device is incapable.

A magnetic sensor device is further provided in the related technology. Magnetic sensing elements are array magnetic sensing elements which used for reading magnetic characteristics of a medium. Magnetic sensing elements are configured at an end part of a plane sidewall of one side of a frame along a direction of a reading range, and the magnetic sensing element is point-like or strip-type. In this technology, a resolution of the magnetic sensing elements manufactured by a printing sintering process is able to reach more than 50 DPI, so that a problem about a magnetic information resolution capability is solved. However, a deviation of the magnetic sensing elements obtained by the printing sintering process is very great, usually about 20%, and even though the magnetic resistance deviation is reduced by a method for changing a resistance, the deviation may also be about 3%-5%. For a 5V common electrode voltage, a voltage deviation of an order of magnitude of at least 150 mV is produced. A magnetic Signal voltage which is able to be detected practically is usually with an order of magnitude of 10 mV, that is, a signal difference (noise signal) caused by a practical magnetic resistance deviation is far greater than an effective signal, so that a great difficulty is brought to signal processing, and it is very difficult to accurately separate the effective signal from the noise signal under a normal condition.

For the problem of relatively stronger noise signal caused by a magnetic resistance deviation of a magnetic image sensor in the related technology, No effective solution has been proposed yet.

SUMMARY

The disclosure is mainly intended to provide a magnetic image sensor, so as to solve the problem of relatively stronger noise signal caused by a magnetic resistance deviation of a magnetic image sensor in the related technology.

In order to achieve the purpose, the disclosure provides a magnetic image sensor, which comprises: a magnetic resistance, arranged along a scanning direction and configured to detect a changed magnetic signal in a range to be detected; a configuration resistance, connected with the magnetic resistance, wherein a resistance value of the configuration resistance is adjustable; and a driving circuit, connected with the magnetic resistance and configured to perform output control on the changed magnetic signal detected by the magnetic resistance.

According to an example embodiment, the configuration resistance is connected with the magnetic resistance (1) in a one-to-one corresponding manner.

According to an example embodiment, the resistance value of the configuration resistance is adjusted to be consistent with a resistance value of the corresponding magnetic resistance.

According to an example embodiment, the magnetic image sensor as claimed in claim 1, wherein the configuration resistance is manufactured by adopting a thick film printing process.

According to an example embodiment, the magnetic image sensor further comprises: a configuration resistance substrate, wherein the configuration resistance is arranged on the configuration resistance substrate; a loading substrate, wherein the magnetic resistance and the driving circuit are arranged on the loading substrate; and a connecting substrate, wherein the configuration resistance substrate and the loading substrate are arranged on the connecting substrate.

According to an example embodiment, the configuration resistance substrate is a substrate manufactured by a ceramic material, and a protective film is arranged on the configuration resistance.

According to an example embodiment, a connecting pad is arranged on the loading substrate, and the configuration resistance comprises: a common electrode and an individual electrode, wherein the individual electrode is connected with the magnetic resistance in a one-to-one corresponding manner on the connecting pad through a connecting wire.

According to an example embodiment, the configuration resistance refers to multiple configuration resistances, the common electrode refers to multiple common electrodes, each common electrode in the multiple common electrodes is shared by two configuration resistances in the multiple configuration resistances, or, an independent electrode is arranged between every two adjacent configuration resistances in the multiple configuration resistances, and each configuration resistance is provided with an independent common electrode branch.

According to an example embodiment, the magnetic resistance is a Tunneling Magnetic Resistance (TMR) manufactured on a semiconductor silicon wafer by vacuum coating, and a first pad and a second pad are configured to connect two ends of the TMR.

According to an example embodiment, the driving circuit (3) comprises: a shift register circuit (3a), and a switching circuit (3b), configured to be turned on to receive the changed magnetic signal detected by the magnetic resistance (1), wherein the magnetic image sensor further comprises: a signal amplification circuit (4), configured to receive a serial SIG output by the driving circuit (3) and perform amplification processing on the serial SIG.

According to the disclosure, the magnetic image sensor including the following structures is adopted: a magnetic resistance, arranged along a scanning direction and configured to detect a changed magnetic signal in a range to be detected; a configuration resistance, connected with the magnetic resistance, wherein a resistance value of the configuration resistance is adjustable; and a driving circuit (3), connected with the magnetic resistance and configured to perform output control on the changed magnetic signal detected by the magnetic resistance. The configuration resistance value with adjustable resistance is connected with the magnetic, resistance, so that the problem of relatively stronger noise signal caused by a magnetic resistance deviation of a magnetic image sensor in the related technology is solved, and an effect of reducing the noise signal of the magnetic image sensor is further achieved.

BRIEF DESCRIPTION OF THE DRAWINGS

The drawings forming a part of the disclosure are adopted to provide a further understanding to the disclosure. Schematic embodiments of the disclosure and descriptions thereof are adopted to explain the disclosure and not intended to form improper limits to the disclosure. In the drawings.

DETAILED DESCRIPTION OF THE EMBODIMENTS

It is important to note that the embodiments in the disclosure and characteristics in the embodiments may be combined without conflicts. The disclosure will be described below with reference to the drawings and in combination with the embodiments in detail.

In order to make the solution of the disclosure better understood by those skilled in the art, the technical solution in the embodiments of the disclosure will be clearly and completely described below in combination with the drawings in the embodiments of the disclosure. Obviously, the described embodiments are not all embodiments but only part of embodiments of the disclosure. All other embodiments obtained by those skilled in the art on the basis of the embodiments in the disclosure without creative work shall fall within the scope of protection of the disclosure.

It is important to note that terms "first", "second" and the like in the specification, claims and drawings of the disclosure are adopted not to describe a specific sequence or order but to distinguish similar objects. It should be understood that data used like this may be exchanged under a proper condition for implementation of the embodiments of the disclosure described here. In addition, terms "include" and "have" and any transformation thereof are intended to cover nonexclusive inclusions. For example, a process, method, system, product or equipment including a series of steps or units is not limited to those steps or units which are clearly listed, but may include other steps or units which are not clearly listed or intrinsic to the process, the method, the product, or the equipment.

Figure 1:
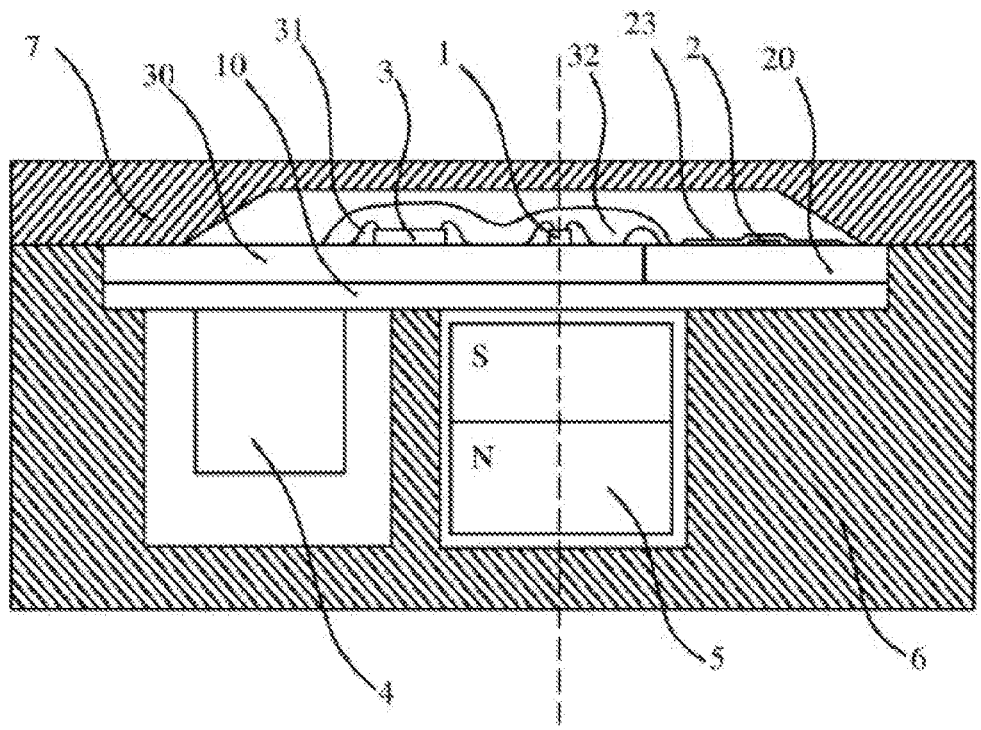
FIG. 1 shows a sectional view of a magnetic image sensor according to an embodiment of the disclosure.
Figure 2:
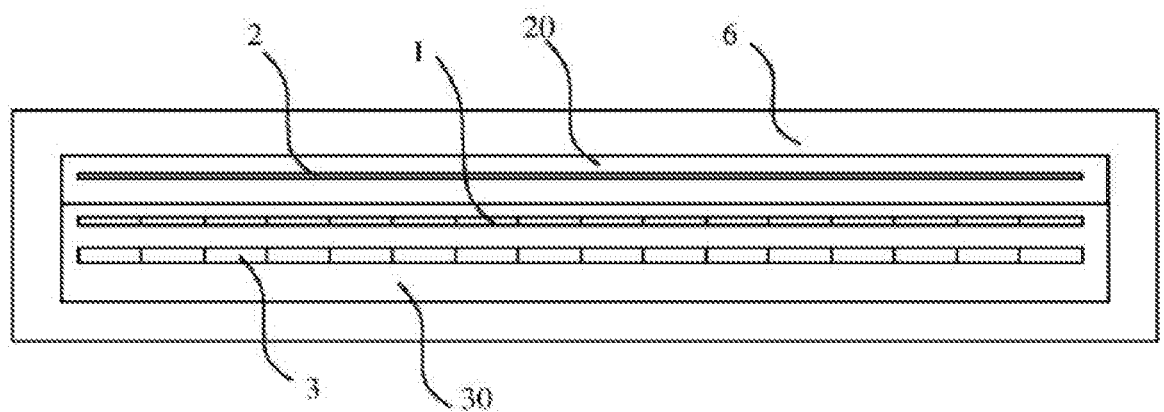
FIG. 2 shows an internal top view of a magnetic image sensor according to an embodiment of the disclosure.

FIG. 1 is a sectional view of a magnetic image sensor according to an embodiment of the disclosure. FIG. 2 is an internal top view of a magnetic image sensor according to an embodiment of the disclosure.

As shown in FIG. 1, the magnetic image sensor includes a magnetic resistance 1, a configuration resistance 2 and a driving circuit 3. The magnetic resistance 1 is arranged along a scanning direction, and is configured to detect a changed magnetic signal in a range to be detected. The magnetic resistance 1 may be one or more magnetic resistances 1. Optionally, the magnetic resistance 1 may be multiple magnetic resistances 1, and the multiple magnetic resistances 1 are linearly arranged along the scanning direction. Optionally, the magnetic resistance 1 of the embodiment of the disclosure is a Tunnel Magnetic Resistance (TMR) manufactured by a semiconductor process. The resistance value of the configuration resistance 2 is adjustable, and may be paired with the magnetic resistance 1 for use. The configuration resistance 2 may be one or more configuration resistances 2. Optionally, the multiple configuration resistances 2 are linearly arranged, and the multiple configuration resistances 2 are connected with the multiple magnetic resistances 1 in a one-to-one corresponding manner. The driving, circuit 3 is configured to perform output control on the changed magnetic signal detected by the magnetic resistance 1, including: to transmit a magnetic field signal detected by the magnetic resistance 1 and to control output of the magnetic field signal. Optionally, each configuration, resistance 2 in the embodiment of the disclosure may include one or more segments of resistance bodies. The driving circuit 3 may also be multiple. Each driving circuit 3 in the multiple driving circuits 3 may control multiple magnetic sensing pixels. The multiple driving circuits 3 are sequentially connected and arranged to perform output control on a signal of the magnetic sensing pixels in the whole detection range.

The magnetic image sensor may further include a signal amplification circuit 4, wherein the signal amplification circuit 4 is configured to perform amplification processing on the detected magnetic signal (for example, a voltage signal converted by the magnetic resistance 1 and the configuration resistance 2).

The magnetic image sensor may further include a magnet 5, wherein the magnet 5 is arranged within the magnetic image sensor. S and N are two poles of the magnets, and the magnet 5 is configured to generate a longitudinal magnetic field. The magnet 5 is arranged along the scanning direction, and is arranged below the magnetic, resistance 1. Optionally, a centerline of the magnet 5 corresponds to the magnetic resistance 1.

In the magnetic image sensor of the embodiment of the disclosure, the configuration resistance 2 may be arranged on a configuration resistance substrate 20. The configuration resistance 2 is manufactured on the configuration resistance substrate 20, and a protective film 23 may also be arranged on the configuration resistance 2. The magnetic resistance 1 and the driving circuit 3 may be arranged on a loading substrate 30, and both the configuration resistance substrate 20 and the loading substrate 30 may be arranged on a connecting substrate 10. Optionally, the connecting substrate 10 may be a nonmagnetic substrate, and is configured to carry the loading substrate 30 and the configuration resistance substrate 20. The magnetic resistance 1 and the driving circuit 3 are connected with the substrate through a connecting wire 31, wherein the connecting wire 31 may be a gold wire or an aluminum wire frequently used for a semiconductor process and connected by a pressure welding process, and is configured to electrically connect the loading substrate 30 with the configuration resistance substrate 20. A protective layer 32 may further be arranged in the magnetic image sensor. After electrical connection with the connecting wire 31 is completed, the protective layer 32 is manufactured to protect the magnetic resistance 1, the driving circuit 3 and the connecting wire 31.

The magnet 5 and the substrates may be arranged in a frame 6, wherein the frame 6 is configured to accommodate the magnet and various substrates. A cover plate 7 is arranged on the frame 6, and the cover plate 7 is configured to protect the magnetic resistance 1, the configuration resistance 2 and the driving circuit 3. An object to be detected (such as paper money) passes through an upper surface of the cover plate 7, a magnetic signal on the object to be detected is detected by the magnetic sensing pixel, and a corresponding signal is output.

According to the magnetic image sensor provided by the embodiment of the disclosure, with adoption of the configuration resistance value with an adjustable resistance, noise of the magnetic image sensor can be reduced, and optionally, the accuracy of reading a signal is improved.

FIG. 2 is a top view of an internal structure of the magnetic image sensor without the cover plate 7. For clarity, only main parts of the magnetic image sensors are shown in the figure. The magnetic image sensor includes the frame 6, as well as the configuration resistance substrate 20, configuration resistance 2, loading substrate 30, magnetic resistance 1 and driving circuit 3 which are mounted therein. The magnetic resistances 1, configuration resistances 2 and driving circuits 3 are composed of multiple, and they are arranged in a straight line along the scanning direction respectively.

Figure 3:
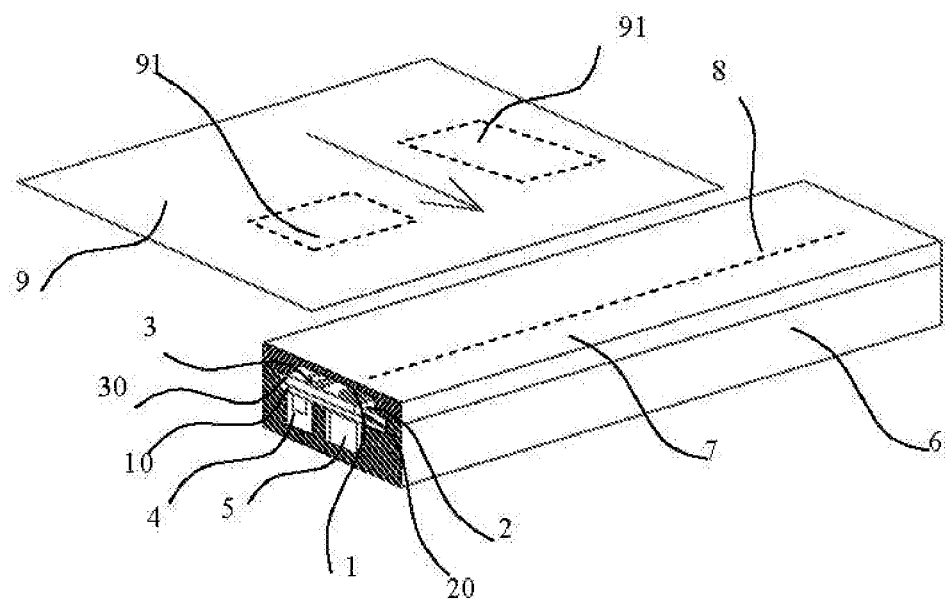
FIG. 3 shows an overall structure diagram of a magnetic image sensor according to an embodiment of the disclosure.

FIG. 3 is an overall structure diagram of a magnetic image sensor according to an embodiment of the disclosure, wherein the sectional view is shown on one side. A detection position 8 is a signal detection position of the magnetic image sensor, and the detection position 8 is a position in the vicinity of an outer surface of the cover plate 7 corresponding to magnetic resistance 1. An object to be detected 9 may be a medium such as paper money, a pattern 91 is formed on the object to be detected 9, and the pattern 91 is a pattern with magnetic information on the object to be detected 9. The object to be detected 9 moves along the direction of the arrow, and passes through the detection position 8 of the magnetic image sensor, a magnetic signal of the pattern 91 with the magnetic information on the object to be detected 9 changes resistance value of the magnetic resistance 1 in a corresponding region, and resistance value changes of the magnetic resistance 1 is converted into voltage signal through internal circuits. When a region without any magnetic information on the object to be detected 9 passes through the detection position 8, the resistance of the magnetic resistance 1 value is not changed, so that a magnetic image on the object to be detected may be detected according to resistance value change conditions of the magnetic resistance 1. Under control of the driving circuit 3, the magnetic image sensor detects signal of a line every time, and along with continuous movement of the object to be detected, the magnetic image sensor continuously reads the magnetic image information of the whole picture on the whole object to be detected.

Figure 4:
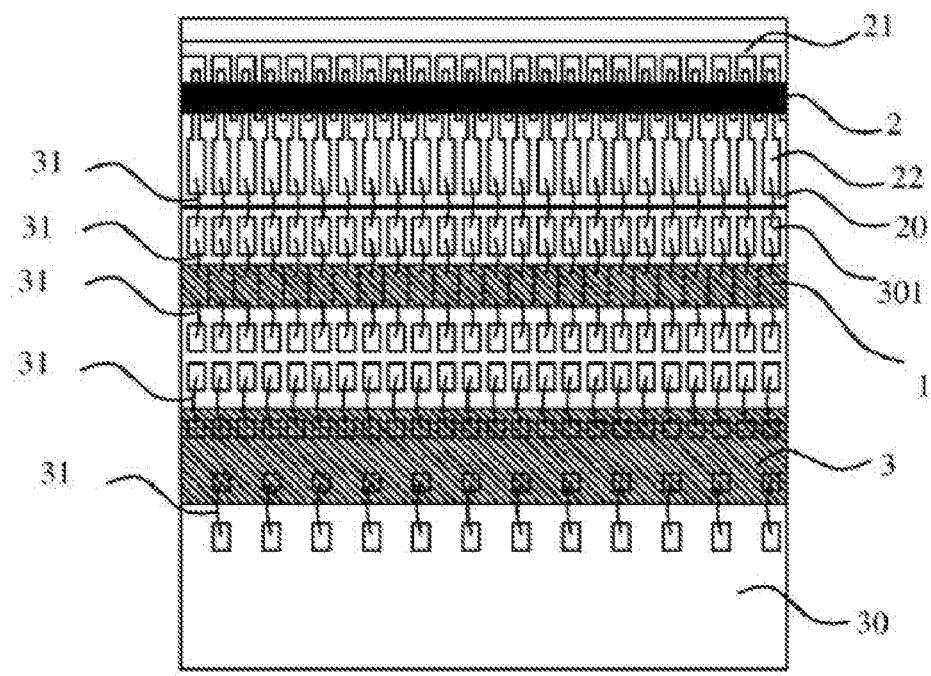
FIG. 4 shows a local enlarged unit structure diagram of a magnetic image sensor according to an embodiment of the disclosure.

FIG. 4 is a local enlarged unit diagram of assembled substrates. Besides the configuration resistance 2, electrodes of the configuration resistance 2 is further arranged on the configuration resistance substrate 20, and include common electrode 21 of the configuration resistance 2 and individual electrode 22 of the configuration resistance 2. The individual electrode 22 is connected with the magnetic resistance 1 in the one-to-one corresponding manner on a connecting pad 301 on the loading substrate 30 through the connecting wire 31. The common electrode 21 may be connected with the loading substrate 30 at certain positions (not shown in the figure), and voltage signal may also be externally and independently provided for the common electrode 21.

Figure 5:
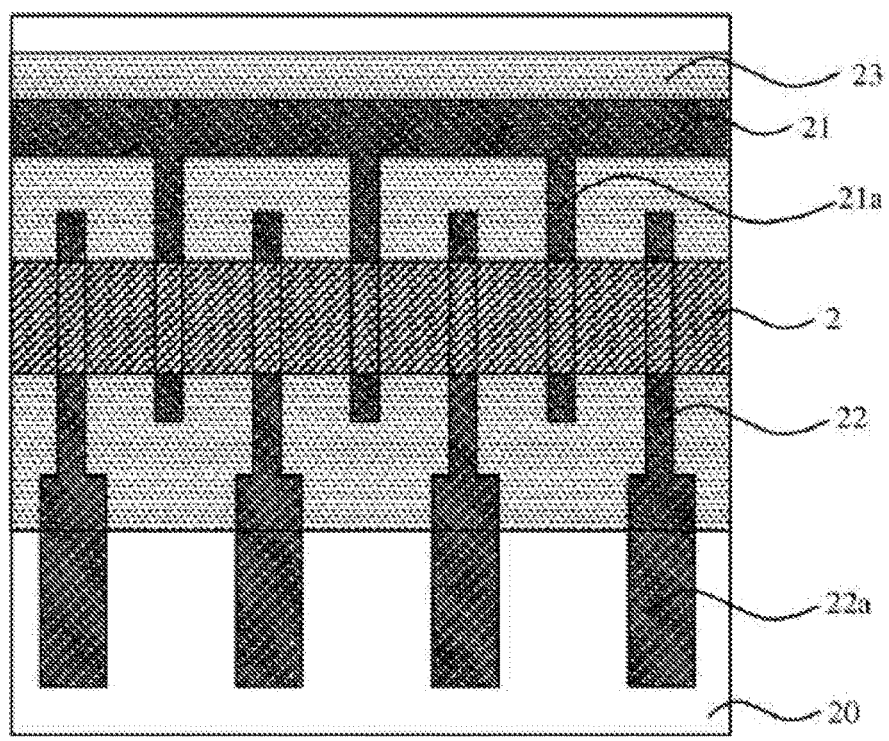
FIG. 5 shows a local enlarged structure diagram of a ceramic substrate of a magnetic image sensor according to an embodiment of the disclosure.

FIG. 5 is a local enlarged diagram of the configuration resistance substrate 20. The configuration resistance substrate 20 is a substrate manufactured from a ceramic material. 21*a* is a branch part, connected with each resistance, of the common electrode 21, and 22*a* is a part, configured to weld the connecting wire 31, of the individual resistance 22. The protective film is protective layers of the configuration resistance 2 and the corresponding electrodes. The magnetic image sensor of the embodiment of the disclosure may implement 50 DPI magnetic image reading, and an arrangement density of the adopted magnetic resistance 1 and corresponding configuration resistance 2 is 0.5 mm.

The configuration resistance 2 may be continuous resistance bodies formed in a printing manner. Optionally, the configuration resistance 2 of the embodiment of the disclosure is manufactured by adopting a thick film screen printing process. A manufacturing process for the configuration resistance is as follows.

(1) The configuration resistance substrate 20 is printed with conductor paste (gold conductor paste is adopted in the embodiment of the disclosure), and a conductor gold component is reduced by high-temperature sintering.

(2) The common electrode 21 and the individual electrode 22 are formed by template etching.

(3) A preset position (specified position) is printed with resistance paste, and high-temperature sintering is performed to form the resistances 22.

(4) A required region is printed with glass paste, and high-temperature sintering is performed to form the protective layers of the resistances and the electrodes.

In the embodiment of the disclosure, the resistance body is continuous resistance bodies formed in the printing manner, the corresponding electrodes are arranged at lower parts of the resistance body, positions of the electrodes determine positions of the resistance body, and meanwhile, each resistance is formed by two parts from two sides of the individual electrode to the common electrode 21.

Figure 6:
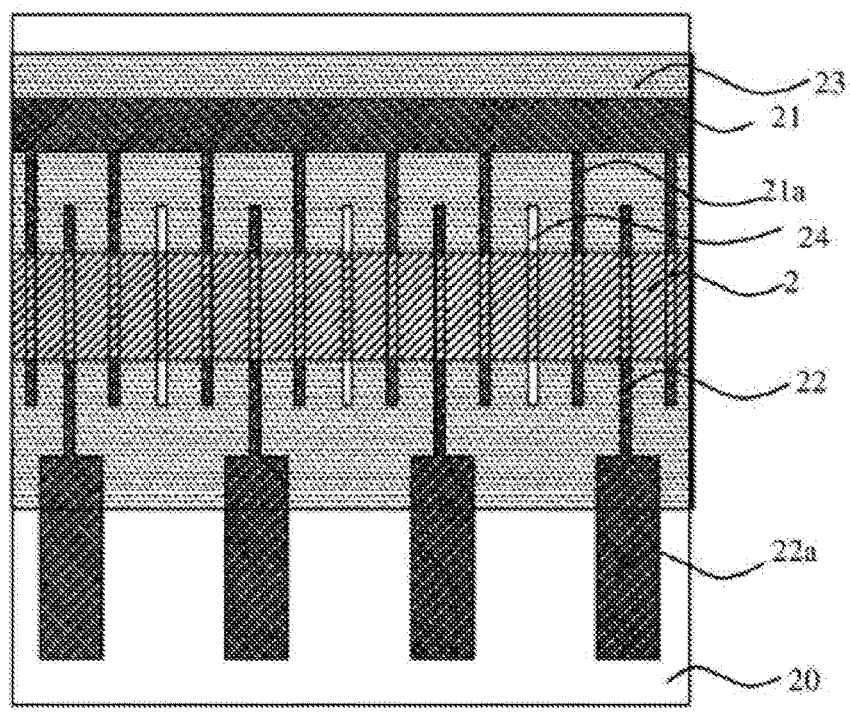
FIG. 6 shows another local enlarged structure diagram of a ceramic substrate of a magnetic image sensor according to an embodiment of the disclosure.

FIG. 6 is another structure of a configuration resistance according to an embodiment of the disclosure. Its basic structure is similar to the embodiment shown in FIG. 5. However, the independent electrode 24 is designed between the adjacent resistances. In the abovementioned structure, the branch 21a of each common electrode 21 is shared by the corresponding two adjacent resistances. While in the structure, an independent electrode 24 is arranged between every two adjacent configuration resistances 2 in the multiple configuration resistances 2, and each configuration resistance is provided with an independent common electrode branch 21a. Such a structure may reduce influence on the adjacent resistances in a resistance repair process.

Figure 7:
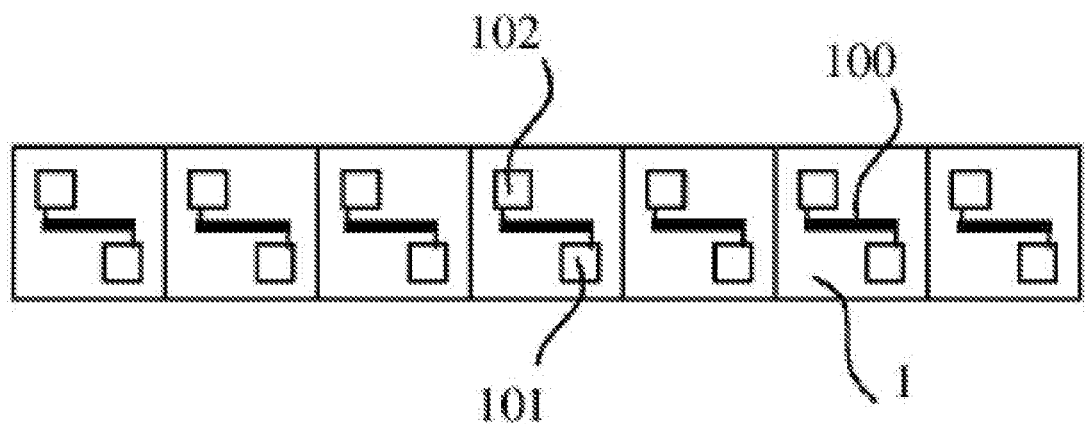
FIG. 7 shows a structure diagram of magnetic signal sensing pixels of a magnetic image sensor according to an embodiment of the disclosure.

FIG. 7 is a structure diagram of a magnetic resistance according to an embodiment of the disclosure. In the figure, a continuous arrangement structure of the multiple magnetic resistances 1 is shown. In the embodiment, the magnetic resistance 1 adopt TMR 100 manufactured on semiconductor silicon wafers by vacuum coating, and the resistance value of the TMRs 100 is changed in a magnetic field environment along with changes in sizes and directions of magnetic fields. Pad 101 and Pad 102 configured to connect two ends of the TMR are arranged at the two ends of the TMR 100, and are configured to electrically connect the TMR with the outside.

The magnetic resistance adopted in the embodiment of the disclosure may be described with a change relationship curve of resistance value and magnetic fields in the magnetic field environment, axis X may represent the direction and intensity of the magnetic field, and axis Y may represent a magnitude of the resistance value of the resistance.

Figure 8:
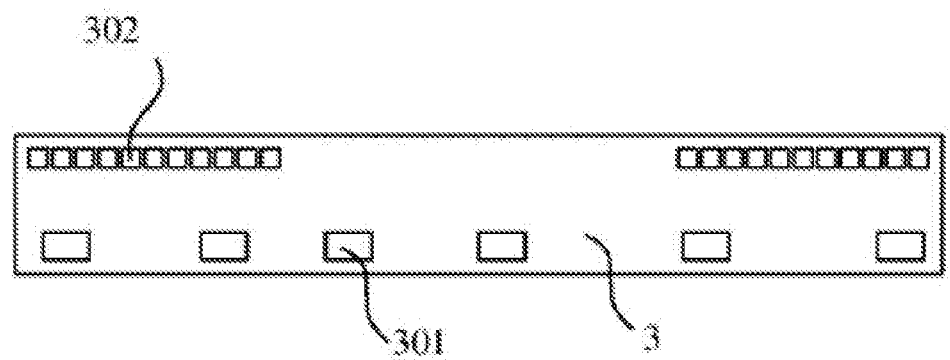
FIG. 8 shows a structure diagram of a driving circuit of a magnetic image sensor according to an embodiment of the disclosure.

FIG. 8 is a structure diagram of a driving circuit 3 according to an embodiment of the disclosure. The driving circuit 3 is a long-strip structure. Receiving terminals 302 at an upper part transmit the magnetic sensing signal on the magnetic resistance to the inside, and each terminal is connected with a magnetic resistance 1. Control terminals at a lower part is configured for circuit control and signal output. The driving circuit 3 is structurally 12 mm long and 1 mm wide, there are 24 receiving terminals at the upper part, which may simultaneously be connected with 25 magnetic resistances 1, and in a scanning process, the signal of the magnetic resistance 1 is sent into the driving circuit 3 through these terminals. The control terminals at the lower part, besides providing working power, at least include driving signal input terminals SI, driving signal output, terminals SO, clock signal CLK, output signal and the like.

Figure 9:
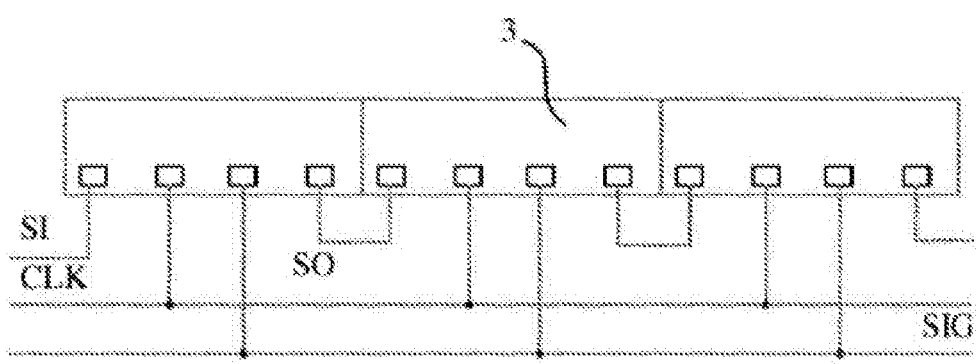
FIG. 9 shows a circuit structure diagram of multi-stage connection of driving circuit of a magnetic image sensor according to an embodiment of the disclosure.

FIG. 9 is a circuit structure diagram of multi-stage connection of driving circuit according to an embodiment of the disclosure. A line driving signal SI is input from the SI terminal of the driving circuit 3 at the end part, and is sequentially transmitted backwards in the driving circuit 3 under the action of a clock signal CLK, an internal switch of a receiving terminal therein is turned on every time to transmit the signal on the corresponding magnetic resistance 1 to a signal wire, and the signal is externally output as an output driving signal SO of the driving circuit 3 after passing through a last switch on the driving circuit 3, and is simultaneously input an SI port of the next driving circuit 3 for continuous backward transmission in the driving circuit 3 until being transmitted to all the driving circuit 3. The signal on all the magnetic resistance 1 connected with the driving circuit 3 is sequentially transmitted onto the SIG wire to form a line of complete scanning data.

Figure 10:
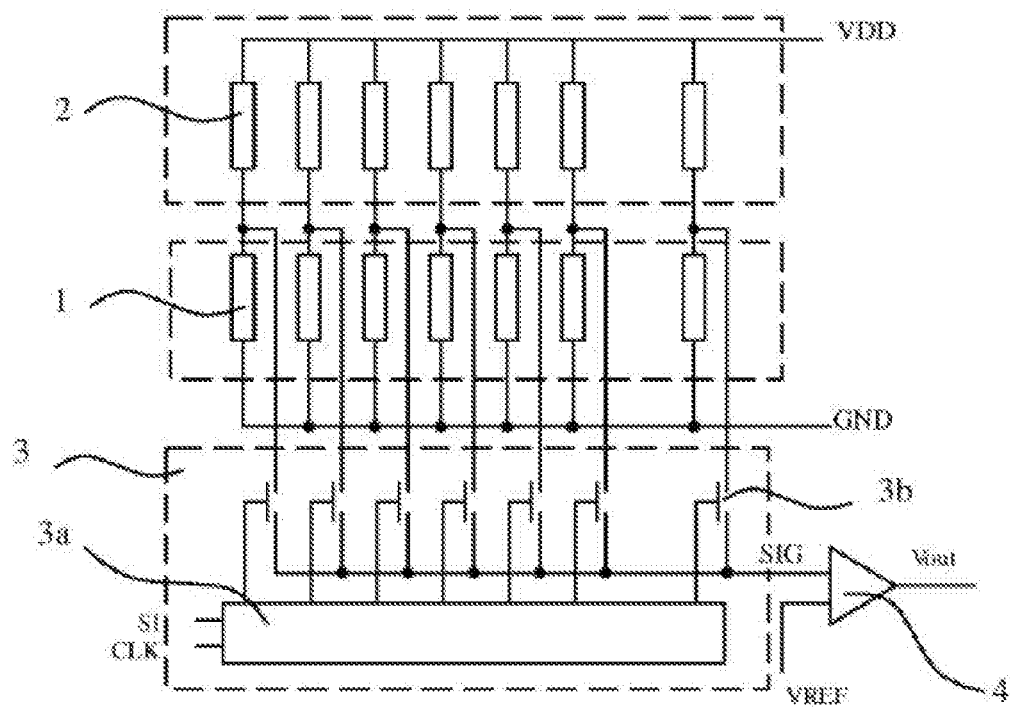
FIG. 10 shows a circuit structure diagram of a magnetic image sensor according to an embodiment of the disclosure.

FIG. 10 is an electrical principle diagram of a magnetic image sensor according to an embodiment of the disclosure. The upper ends of the configuration resistance 2 is the common electrode 21 connected with a power supply VDD. The individual electrode at the lower ends is connected with the magnetic resistance 1 in the one-to-one corresponding manner. The lower ends of the magnetic resistance 1 is the common electrode 2 connected with the Ground (GND). A leading-out signal acquisition terminal is arranged between the magnetic resistance 1 and the configuration resistance 2, and is connected with the receiving terminals of the driving circuit 3.

Each driving circuit 3 includes two parts of functions, 3a is a shift register circuit, and 3b is a switching circuit. The driving signal SI is a line driving pulse signal. Switches in the switching circuit 3b are turned on one by one under the action of clocks to input the signal detected by the magnetic resistance 1 into the driving circuit 3, and the driving circuit convert the collected signal into serial signal for external output to a post amplification circuits for signal amplification.

Figure 11:
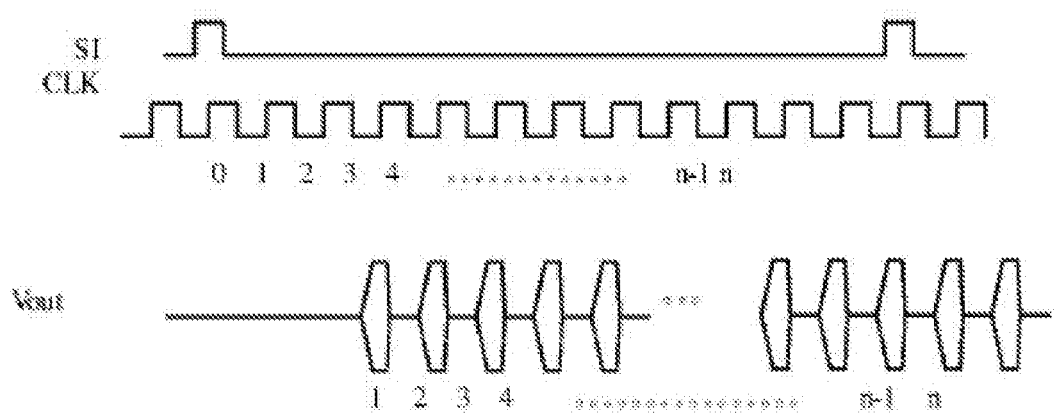
FIG. 11 shows a sequence diagram of a magnetic image sensor according to an embodiment of the disclosure.

FIG. 11 is a sequence diagram of a magnetic image sensor according to an embodiment of the disclosure. As mentioned above, the SI signal is a line driving pulse signal during scanning, every pulse completes scanning of a line, and Vout is an output signal obtained by amplifying the signal by the amplification circuit. Internal functions of resetting and the like of the driving circuit 3 require to occupy a certain time, so that the output signal may usually be a few clock periods later than the SI signal, and the resistance value of the magnetic resistance 1 may be increased and may also be decreased according to the intensity and direction of the magnetic field in the scanning environment. Therefore, the output signal may be higher than a reference potential, and may also be lower than the reference potential.

The magnetic image sensor of the embodiment of the disclosure may be a magnetic image sensor capable of scanning a 192 mm width, and internally includes 384 magnetic resistances, and an arrangement period of each magnetic resistance is 0.5 mm, so that a 50 DPI scanning resolution is formed. Meanwhile, 384 configuration resistances 2 corresponding to the magnetic resistance one to one are arranged, each driving circuit 3 may control 24 magnetic resistances 1, and totally 16 driving circuits are used to drive the 384 magnetic resistances 1.

In the circuit structure of the embodiment of the disclosure, the magnetic resistance 1 (the resistance value is represented with Rm) and the configuration resistance 2 (the resistance value is represented with Rt) are connected in series between the power supply VDD and the GND, and under the condition of no external magnetic fields, a potential between the two resistances is:

$$VREF0=[Rm/(Rm+Rt)]*VDD \quad (1).$$

VREF0 is a potential of each magnetic resistance without any magnetic field (i.e. a reference potential of each pixel), and the Rm resistance value is changed along with a change of an external magnetic field when there is the external magnetic field, so that a change Vsig in the voltage signal is generated. This voltage signal is superposed with the VREF0. In the scanning process, a signal acquired by the driving circuit 3 between the two resistances is a superposed signal of two voltages, that is, the serial signal output by the driving circuit 3 is VREF0+Vsig.

After the serial signal output by the driving circuit 3 passes through the amplification circuit, if an amplification factor of the amplification circuit is N and a reference potential of the amplification circuit is VREF, a signal output by the amplification circuit is:

$$Vout=[(VREF0-VREF)+Vsig]*N \quad (2).$$

Considering that Vsig is positive or negative, for avoiding a negative value of the output signal, a difference of VREF0−VREF is usually required to be larger than a maximum absolute value of Vsig.

Considering that there may exist certain deviations of both Rm and Rt in a practical manufacturing process and the deviation is usually between 10% and 20%, VREF0 between the resistances of each pair may also be greatly different, thereby causing signal distortion brought by deviations of reference potentials between signals in the output signal Vout. In order to eliminate the deviation of the reference potentials between the pixels, the resistance repair method is adopted for the configuration resistance 2 in the embodiment of the disclosure. The configuration resistance 2 is manufactured by sintering the resistance paste including ruthenium oxide as a main component, and a pulse voltage of certain power may be applied to the resistance body to reduce the resistance value (called as resistance value repair for short).

Figure 12:
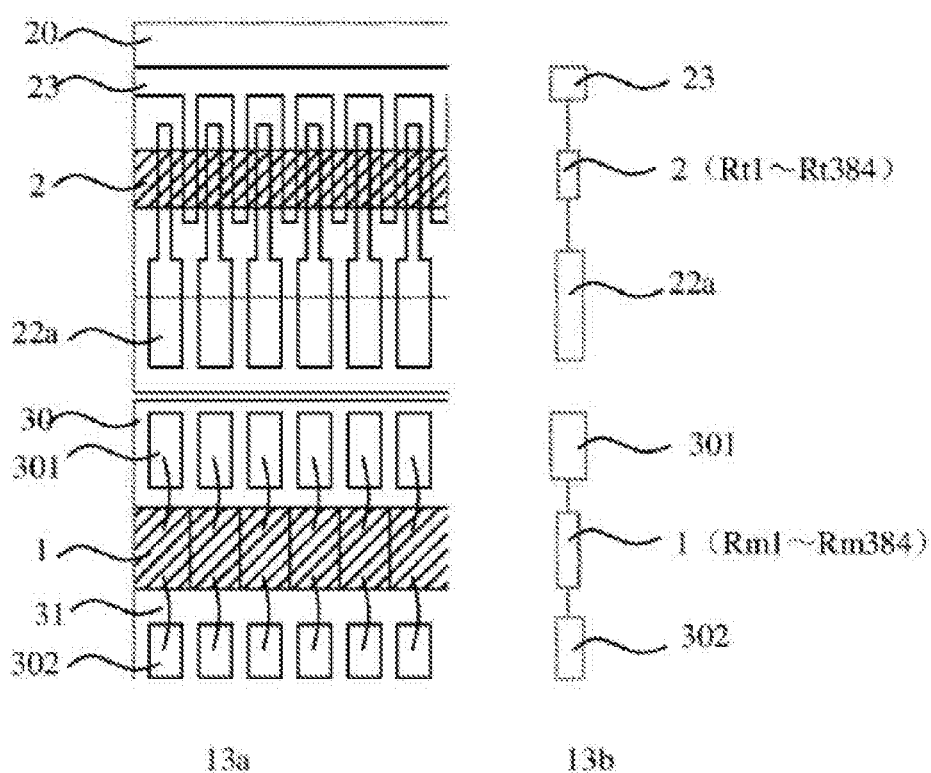
FIG. 12 shows a substrate state and resistance repair principle diagram during resistance repair according to an embodiment of the disclosure.

FIG. 12 is a substrate state and resistance repair principle diagram during resistance repair according to an embodiment of the disclosure. During resistance repair, the configuration resistance substrate 20 has yet not been connected with the loading substrate 30 through the connecting wire 31, the upper ends of the configuration resistance 2 on the configuration resistance substrate 20 are connected through the common electrode 2, and the individual resistances 22 (22*a*) at the lower ends are separated. That is, each configuration resistance 2 is independent. The magnetic, resistance 2 on the loading substrate 30 is connected with the pad 301 and pad 302 on the loading substrate 30 through the connecting wire 31 respectively, but pad 301 and pad 302 are respectively independent, so that the magnetic resistances are also respectively independent at this moment. In the embodiment of the disclosure, 384 magnetic resistances 1 (also called as magnetic sensing pixels sometimes) and 384 configuration resistances 2 are used, the resistance value of the nth magnetic sensing pixel is Rmn, and the resistance of the corresponding configuration resistance 2 refers to Rtn (n=1~384).

In the embodiment of the disclosure, a resistance repair method of resistance balancing is adopted to reduce deviations of reference signal between the pixels. A specific method is to regulate the Rtn resistance value of all the configuration resistances 2 to be consistent with the Rmn resistance value of the corresponding magnetic resistance 1. In the embodiment of the disclosure, a design target value of the magnetic resistance 1 is 5 KΩ, and the practical resistance value of the magnetic resistance 1 practically manufactured by a vacuum coating process is between 4 KΩ-6 KΩ, if calculated by a maximum deviation of 20%. The configuration resistance 2 is printed and sintered from thick film resistance paste, the maximum deviation is about 15%, the design resistance value of the configuration resistance 2 is set to be 8 KΩ, and the practical, resistance value ranges from 6.8 KΩ–9.2 kΩ. Because resistance repair of Rt may only reduce the resistance, the practical resistance value of Rt is higher than practical resistance value of Rm.

Performing resistance repair on thick film resistances is a common method for a thick film resistance manufacturing process. However, target resistance value is usually set, and then resistance of all the resistances is repaired to be the unified resistance value. For example, the condition that practical resistance of the thick film resistances value ranges from 6.8 KΩ–9.2 KΩ may also be adopted as an example. If the set target resistance value is 5 KΩ, the resistance value of all the resistances is repaired to be close to 5 KΩ.

The resistance repair method adopted in the embodiment of the disclosure is to regulate the Rt resistance value to be consistent with Rm, so that the Rtn target resistance value is the corresponding Rmn resistance value. Two methods are adopted in a practical resistance repair process. One is that the resistance Rmn of a magnetic resistance 1 is tested every time, and is determined as target resistance, and then resistance repair is performed on the corresponding configuration resistance 2 to make Rtn=Rmn (resistance repair accuracy may achieve a deviation of smaller than 1% according to a present process level). The other is that the resistance value (Rm1~Rm384) of all the magnetic resistance 1 is tested and stored in a memory of equipment as target values of the configuration resistance 2 (Rt1~Rt384) respectively, and then resistance repair is performed on the configuration resistance 2 one by one.

During resistance repair, a probe contacts with the protective film 23, 22*a*, pad 301 and pad 302, the resistance Rmn between pad 301 and pad 302 is tested at first, the resistance value is stored in the equipment as a target value of the corresponding configuration resistance 2. Then the resistance between protective film 23 and 22*a* (initial value before resistance repair) is tested, the initial value is compared with the target value, a certain voltage pulse is applied for resistance repair between protective film 23 and 22*a* according to a difference value between to reduce the resistance value of the configuration resistance 2. Then the resistance value between protective film 23 and 22*a* is tested again, and is compared with the target value, resistance repair is performed on the resistance again according to a new difference value, the operations are repeated for many times until the resistance value between protective film 23 and 22*a* is consistent with the target value, and then resistance repair is performed on the next resistance.

No matter whether the resistance of the magnetic resistance 1 is high or low, the configuration resistance 2 subjected to resistance repair is consistent with the resistance value of the corresponding magnetic resistance 1. From formula (1), it can be seen that, when Rt=Rm, $$VREF0=VDD/2 \quad (3).$$

That is, no matter the original resistance value of Rm, as long as the Rt resistance value is equal to Rm by resistance repair, signal reference potentials of all the pixels may be completely consistent, and are a half of a power voltage.

In addition, a magnitude of the signal reference potential may also be regulated by repairing the resistance Rt according to a requirement. A target resistance repair value of Rt may be not a value of Rm but a value related to a coefficient k, i.e. Rt=kRm, and the coefficient k may be regulated to change a magnitude of VREF0. For example:

when $k=0.5$, $VREF0=(2/3)*VDD$, and when $k=2$, $VREF0=(1/3)*VDD$.

After resistance repair is completed, 22a of the configuration resistance substrate 20 and 301 of the loading substrate 30 are connected through the connecting wire, thereby implementing electrical connection between the two substrates. After connection is completed, the protective layer 32 is adopted for encapsulation protection over the connecting wire and a bare chip.

The image sensor of the embodiment adopts a resistance balancing signal detection method, so that the image resolution of the magnetic signal may be ensured, noise of the product may also be greatly reduced, and the signal reading accuracy is improved.

The above is only the preferred embodiment of the disclosure and not intended to limit the disclosure. For those skilled in the art, the disclosure may have various modifications and variations. Any modifications, equivalent replacements, improvements and the like made within the spirit and principle of the disclosure shall fall within the scope of protection of the disclosure.

What is claimed is:

1. A magnetic image sensor, comprising:
    a magnetic resistance (1), arranged along a scanning direction and configured to detect a changed magnetic signal in a range to be detected;
    a configuration resistance (2), connected with the magnetic resistance (1), wherein a resistance value of the configuration resistance (2) is adjustable; and
    a driving circuit (3), connected with the magnetic resistance (1) and configured to perform output control on the changed magnetic signal detected by the magnetic resistance (1);
    wherein the magnetic resistance (1) is a Tunneling Magnetic Resistance (TMR) (100) manufactured on a semiconductor silicon wafer by vacuum coating, and a first pad (101) and a second pad (102) are configured to connect two ends of the TMR (100).

2. The magnetic image sensor as claimed in claim 1, wherein the configuration resistance (2) is connected with the magnetic resistance (1) in a one-to-one corresponding manner.

3. The magnetic image sensor as claimed in claim 2, wherein the resistance value of the configuration resistance (2) is adjusted to be consistent with a resistance value of the corresponding magnetic resistance (1).

4. The magnetic image sensor as claimed in claim 1, wherein the configuration resistance (2) is manufactured by adopting a thick film printing process.

5. The magnetic image sensor as claimed in claim 1, further comprising:
    a configuration resistance substrate (20), wherein the configuration resistance (2) is arranged on the configuration resistance substrate (20);
    a loading substrate (30), wherein the magnetic resistance (1) and the driving circuit (3) are arranged on the loading substrate (30); and
    a connecting substrate (10), wherein the configuration resistance substrate (20) and the loading substrate (30) are arranged on the connecting substrate (10).

6. The magnetic image sensor as claimed in claim 5, wherein the configuration resistance substrate (20) is a substrate manufactured by a ceramic material, and a protective film (23) is arranged on the configuration resistance (2).

7. The magnetic image sensor as claimed in claim 5, wherein a connecting pad (301) is arranged on the loading substrate (30), and the configuration resistance (2) comprises:
    a common electrode (21) and
    an individual electrode (22), wherein the individual electrode (22) is connected with the magnetic resistance (1) in a one-to-one corresponding manner on the connecting pad (301) through a connecting wire (31).

8. The magnetic image sensor as claimed in claim 7, wherein the configuration resistance (2) refers to multiple configuration resistances (2),
    the common electrode (21) refers to multiple common electrodes (21), each common electrode (21) in the multiple common electrodes (21) is shared by two configuration resistances (2) in the multiple configuration resistances (2),
    or,
    an independent electrode (24) is arranged between every two adjacent configuration resistances (2) in the multiple configuration resistances (2), and each configuration resistance is provided with an independent common electrode branch (21a).

9. The magnetic image sensor as claimed in claim 1, wherein the driving circuit (3) comprises:
    a shift register circuit (3a), and
    a switching circuit (3b), configured to be turned on to receive the changed magnetic signal detected by the magnetic resistance (1), wherein the magnetic image sensor further comprises:
    a signal amplification circuit (4), configured to receive a serial SIG output by the driving circuit (3) and perform amplification processing on the serial SIG.

* * * * *